United States Patent
Fujikawa et al.

(10) Patent No.: US 8,168,314 B2
(45) Date of Patent: *May 1, 2012

(54) METHOD FOR EVALUATING INTERNAL SHORT-CIRCUIT OF BATTERY, DEVICE FOR EVALUATING INTERNAL SHORT-CIRCUIT OF BATTERY, BATTERY, BATTERY PACK AND THEIR MANUFACTURING METHODS

(75) Inventors: Masato Fujikawa, Osaka (JP); Shinji Kasamatsu, Osaka (JP); Hajime Nishino, Nara (JP); Mikinari Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 47 days.

This patent is subject to a terminal disclaimer.

(21) Appl. No.: 12/446,869

(22) PCT Filed: Nov. 21, 2007

(86) PCT No.: PCT/JP2007/072553
§ 371 (c)(1),
(2), (4) Date: Apr. 23, 2009

(87) PCT Pub. No.: WO2008/072456
PCT Pub. Date: Jun. 19, 2008

(65) Prior Publication Data
US 2009/0286148 A1    Nov. 19, 2009

(30) Foreign Application Priority Data

Dec. 15, 2006 (JP) ................................. 2006-338114
Feb. 6, 2007 (JP) ................................. 2007-026742
Oct. 25, 2007 (JP) ................................. 2007-278044

(51) Int. Cl.
*H01M 2/00* (2006.01)
*H01M 10/48* (2006.01)

(52) U.S. Cl. ............................................ 429/61; 429/90
(58) Field of Classification Search ................. 429/61, 429/62, 94; 324/426, 90
See application file for complete search history.

(56) References Cited

U.S. PATENT DOCUMENTS

| | | | | |
|---|---|---|---|---|
| 6,054,233 | A * | 4/2000 | Vourlis | 429/61 |
| 6,872,491 | B2 * | 3/2005 | Kanai et al. | 429/223 |
| 8,081,000 | B2 * | 12/2011 | Kasamatsu et al. | 324/426 |
| 2002/0150820 | A1 * | 10/2002 | Kanai et al. | 429/231.1 |
| 2003/0198863 | A1 | 10/2003 | Murashige et al. | |
| 2004/0053134 | A1 * | 3/2004 | Ozaki et al. | 429/231.1 |

(Continued)

FOREIGN PATENT DOCUMENTS
EP    0 851 525 A1    7/1998

(Continued)

OTHER PUBLICATIONS

European Search Report issued in European Patent Application No. 07832283.1-1227, mailed Sep. 29, 2010.

*Primary Examiner* — Richard V Muralidar
(74) *Attorney, Agent, or Firm* — McDermott Will & Emery LLP

(57) ABSTRACT

Methods for evaluating battery safety under internal short-circuit conditions are improved to eliminate variations in evaluation results and accurately evaluate battery safety under internal short-circuit conditions. An internal short-circuit is caused in a battery by using an internal short-circuit causing method in which battery information obtained upon the occurrence of an internal short-circuit hardly changes with the structure of the battery. At this time, the battery information is detected to accurately evaluate the safety of the battery upon the internal short-circuit and identify the safety level.

39 Claims, 4 Drawing Sheets

U.S. PATENT DOCUMENTS

2004/0096733 A1* 5/2004 Shibamoto et al. ............. 429/94
2005/0253591 A1* 11/2005 Kasamatsu et al. ........... 324/432

FOREIGN PATENT DOCUMENTS

| EP | 1 130 669 A1 | 9/2001 |
| FR | 2 020 290 A1 | 7/1970 |
| JP | 10-106530 | 4/1998 |
| JP | 11-102729 | 4/1999 |
| JP | 2002-352864 | 12/2002 |
| JP | 2004-247064 | 9/2004 |
| JP | 2004-281292 | 10/2004 |
| JP | 2005-327616 | 11/2005 |

* cited by examiner

METHOD FOR EVALUATING INTERNAL SHORT-CIRCUIT OF BATTERY, DEVICE FOR EVALUATING INTERNAL SHORT-CIRCUIT OF BATTERY, BATTERY, BATTERY PACK AND THEIR MANUFACTURING METHODS

RELATED APPLICATIONS

This application is the U.S. National Phase under 35 U.S.C. §371 of International Application No. PCT/JP2007/072553, filed on Nov. 21, 2007, which in turn claims the benefit of Japanese Application No. 2006-338114, filed on Dec. 15, 2006, Japanese Application No. 2007-026742, filed Feb. 6, 2007 and Japanese Application No. 2007-278044, filed Oct. 25, 2007, the disclosures of which Applications are incorporated by reference herein.

TECHNICAL FIELD

The present invention relates to a method for evaluating an internal short-circuit of a battery, a device for evaluating an internal short-circuit of a battery, a battery, a battery pack, and methods for producing a battery and a battery pack. More particularly, the present invention mainly relates to an improvement in evaluation methods of battery internal short-circuits.

BACKGROUND ART

Lithium secondary batteries, which are lightweight and have high energy density, are mainly commercialized as the power source for portable devices. Also, lithium secondary batteries are currently receiving attention as large-sized, high-output power sources (e.g., power sources for automobiles), and their active development is underway.

In lithium secondary batteries, an insulating layer is provided between the positive electrode and the negative electrode. The insulating layer has the function of electrically insulating the positive and negative electrode plates from each other while retaining an electrolyte. A resin insulating layer is widely used. The resin insulating layer easily shrinks. Thus, when a lithium secondary battery is stored in a very high temperature environment for an extended period of time, an internal short-circuit tends to occur due to a physical or direct contact between the positive electrode and the negative electrode. The prevention of an internal short-circuit is becoming an increasingly important technical problem to be solved particularly in view of the recent trend of the insulating layer becoming increasingly thinner as the capacity of lithium secondary batteries is becoming increasingly higher. Once an internal short-circuit occurs, the short-circuit further expands due to Joule's heat generated by the short-circuit current. In some cases, the battery may overheat.

It is also very important to assure safety when batteries internally short-circuit. Thus, techniques to enhance the safety of batteries under internal short-circuit conditions are being extensively developed. For example, there has been proposed a technique in which insulating tape is affixed to the exposed part of a current-collecting terminal of a positive electrode or negative electrode to prevent an internal short-circuit between the current-collecting terminals (for example, see Patent Document 1). There has also been proposed a technique in which an ion-conductive insulating layer composed of ceramic particles and a binder is printed on an electrode plate (for example, see Patent Document 2).

Further, to assure safety under an internal short-circuit condition, it is also very important to accurately evaluate the safety of a battery under an internal short-circuit condition. Battery evaluation tests for evaluating exothermic behavior under an internal short-circuit condition as a safety item of batteries such as lithium ion secondary batteries are defined, for example, by UL standards for lithium batteries (UL1642) and Standards of Battery Association of Japan (SBA G1101-1997 lithium secondary battery safety evaluation standard guidelines). These test methods are employed, for example, in patent documents to evaluate battery safety (for example, see Patent Document 3).

Conventional evaluation tests include, for example, nail penetration tests and crush tests. A nail penetration test is an internal short-circuit test which is conducted by causing a nail to penetrate through a battery from its side face or sticking a nail thereinto. When a nail is stuck, a short-circuit occurs between the positive electrode, the negative electrode, and the nail inside the battery, so that a short-circuit current flows through the short-circuited area while generating Joule's heat. Safety is evaluated by observing changes in battery temperature, battery voltage, etc., based on these phenomena. Also, a crush test is an internal short-circuit test which is performed by physically deforming a battery by using a round bar, square bar, flat plate, etc. In this manner, an internal short-circuit is caused between the positive electrode and the negative electrode, and safety is evaluated by observing changes in battery temperature, battery voltage, etc. However, conventional battery evaluation methods cannot accurately evaluate safety under internal short-circuit conditions.

Also, in considering the uses of a battery, it is necessary to understand which level of safety performance the battery has in the event of an internal short-circuit, such as "generates no heat" or "generates a little heat". However, since conventional evaluation methods cannot accurately evaluate safety under internal short-circuit conditions, it is also very difficult to identify safety level.

Patent Document 1: Japanese Laid-Open Patent Publication No. 2004-247064
Patent Document 2: Japanese Laid-Open Patent Publication No. Hei 10-106530
Patent Document 3: Japanese Laid-Open Patent Publication No. Hei 11-102729

DISCLOSURE OF THE INVENTION

Problem to be Solved by the Invention

In order to solve the above-discussed problems, the present inventors have made diligent studies. As a result, they have found that safety in the event of an internal short-circuit of a battery changes greatly depending on the location of the short-circuit inside the battery (e.g., distance from battery surface, exposed part of current-collecting terminal, electrode active material layer), the shape of the battery, etc.

For example, the safety in the event of a short-circuit near the surface of a battery is apparently high, compared with that in the event of a short-circuit at an inner part, because of the influence of heat radiation. Also, when short-circuits occur simultaneously at a location where low-resistant members such as electrode current-collecting terminals face each other and a location where relatively high-resistant members such as electrode active material layers face each other, most of the short-circuit current resulting from the short-circuits flows through the location where the low-resistant current-collecting terminals face each other. Hence, most of the Joule's heat is also generated at the location where the current-collecting terminals face each other, not the location where the active material layers with poor thermal stability face each other. As a result, the safety under internal short-circuit conditions is apparently high.

That is, depending on where a short-circuit occurs, even a battery which can be more dangerous may be improperly evaluated as safe if the evaluation method is not appropriate. The present inventors have found that in order to accurately evaluate the safety of a battery under an internal short-circuit condition, it is very important to cause an internal short-circuit at a desired location that is not in an area leading to improper evaluation of being apparently safe, in view of the battery constitution such as shape and internal structure.

In the case of nail penetration tests, the locations of short-circuits are limited to an outer part of a battery, particularly an outermost part. The evaluation results are therefore greatly affected by the constitution of the outer part of the battery. For example, in a nail penetration test, the amount of heat W (unit: watt) generated by a short-circuit is represented by the following formula:

$$W = V^2 \times R1/(R1+R2)^2$$

where V represents the battery voltage (unit: volt), R1 represents the resistance (unit: ohm) of the short-circuited area, and R2 represents the internal resistance (unit: ohm) of the battery.

This formula clearly indicates that the amount of heat W generated by the short-circuit and the resistance R1 of the short-circuited area are not directly proportional, that as the resistance R1 of the short-circuited area increases, the amount of heat generation W increases, and that after the amount of heat generation W becomes maximum, even if the resistance R1 of the short-circuited area further increases, the amount of heat generation W decreases. In a nail penetration test, when safety is evaluated at a low-resistant part of the outermost part, such as an exposed part of a current-collecting terminal on which there is no active material layer, the evaluation result becomes "safe". However, if a foreign object enters a battery, depending on the size, shape, hardness, etc., an internal short-circuit may occur at an area different from areas that are usually subjected to nail penetration tests. That is, nail penetration test methods cannot accurately evaluate safety under internal short-circuit conditions that may occur in the market.

Also, with respect to crush test methods, the present inventors have found from the analysis of short-circuit behavior in crush tests that two or more locations are short-circuited at one time or there is a variation in short-circuited locations among tests. It is therefore thought that crush test methods also cannot accurately evaluate safety under internal short-circuit conditions.

An object of the present invention is to provide a battery internal short-circuit evaluation method and a battery internal short-circuit evaluation device for conducing a short-circuit test at a desired location inside a battery, evaluating the safety of the battery under an internal short-circuit condition in a comprehensive manner, and identifying its safety level.

Another object of the present invention is to provide a method for producing a battery and a battery pack whose safety has been identified by the battery internal short-circuit evaluation method or battery internal short-circuit evaluation device, and a battery pack produced by the production method.

Means for Solving the Problem

That is, the present invention provides a method for evaluating the safety of a battery upon an internal short-circuit. The battery includes: an electrode group comprising a positive electrode, a negative electrode, and an insulating layer for electrically insulating the positive and negative electrodes from each other, the positive and negative electrodes and the insulating layer being wound or laminated; an electrolyte; a housing for housing the electrode group and the electrolyte, the housing including an external terminal; and a current-collecting terminal for electrically connecting the electrode group and the external terminal. The method includes: causing an internal short-circuit in the battery by a method selected from the group consisting of the following methods (a) to (h); and detecting the occurrence of the internal short-circuit by detecting battery information obtained from the battery or by visual inspection.

(a) an internal short-circuit causing method comprising inserting a foreign object into the battery and applying a pressure to the battery;

(b) an internal short-circuit causing method comprising inserting a shape memory alloy or bimetal into the battery and heating or cooling the battery;

(c) an internal short-circuit causing method comprising removing a part of the insulating layer of the battery and applying a pressure to the removed part of the insulating layer;

(d) an internal short-circuit causing method for the battery that includes the positive electrode having an exposed part of the current-collecting terminal at an outermost part, the method comprising inserting a pressing member with a sharp edge until it reaches the exposed part of the current-collecting terminal while applying ultrasonic waves thereto, and further inserting the pressing member without applying the ultrasonic waves;

(e) an internal short-circuit causing method for the battery that includes the positive electrode having an exposed part of the current-collecting terminal at an outermost part, the method comprising cutting the exposed part of the current-collecting terminal of the positive electrode at the outermost part and inserting a pressing member with a sharp edge into the cut part;

(f) an internal short-circuit causing method comprising inserting a pressing member with a sharp edge into a bottom of the battery;

(g) an internal short-circuit causing method for the battery including a laminated-type electrode group, the method comprising inserting a pressing member with a sharp edge into a side face of the battery; and (h) an internal short-circuit causing method comprising heating an outer face of the battery to a temperature equal to or higher than the melting point of the insulating layer to melt the insulating layer of the battery.

Preferably, the battery information is the voltage of the battery, and the occurrence of the internal short-circuit is detected by detecting a decrease in the voltage of the battery.

Preferably, the battery information is the temperature of the battery, and the occurrence of the internal short-circuit is detected by detecting a change in the temperature of the battery.

Preferably, the battery information is sound produced by the battery, and the occurrence of the internal short-circuit is detected by detecting sound produced by the battery due to the internal short-circuit.

Preferably, the battery information is light produced by the battery, and the occurrence of the internal short-circuit is detected by detecting light produced by the battery due to the internal short-circuit.

The internal short-circuit causing method (a) is preferably performed by inserting a foreign object into a location inside the electrode group of the battery where the positive electrode and the negative electrode face each other, and applying a pressure to the location into which the foreign object is inserted to locally crush the insulating layer interposed between the positive electrode and the negative electrode.

In another embodiment, the internal short-circuit causing method (a) is preferably performed by disassembling the assembled battery, taking the electrode group out of the housing, inserting a foreign object into a location inside the electrode group where the positive electrode and the negative electrode face each other, reassembling, and applying a pressure.

In another embodiment, the internal short-circuit causing method (a) is preferably performed by disassembling the assembled battery, taking the electrode group from the housing, and inserting an insulating sheet and a foreign object in layers into a location inside the electrode group where the positive electrode and the negative electrode face each other, reassembling, pulling out the insulating sheet, and applying a pressure.

More preferably, the insulating sheet is heat-resistant.

More preferably, the application of the pressure is stopped upon detection of the occurrence of the internal short-circuit.

More preferably, the pressure applied is monitored and the application of the pressure is stopped upon detection of a decrease in the pressure.

More preferably, the pressure is applied at a constant speed.

More preferably, the pressure applied is constant.

More preferably, the pressure applied is 50 kg/cm$^2$ or less.

More preferably, the foreign object is a conductive foreign object.

More preferably, the foreign object is anisotropic.

More preferably, the foreign object has at least one shape selected from the group consisting of a horseshoe-like shape, a cone, a pyramid, a cylinder (length/diameter=1.5), and a rectangular parallelepiped (the length of the longest side/the length of the other two sides=1.5).

More preferably, the foreign object is inserted before the electrolyte is injected in a battery production process.

More preferably, the battery is a lithium secondary battery, the foreign object includes Ni, Cu, stainless steel, or Fe, and the foreign object is inserted between the negative electrode and the insulating layer at a location where the positive electrode and the negative electrode face each other.

More preferably, the battery is a lithium secondary battery, the foreign object includes Al or stainless steel, and the foreign object is inserted between the positive electrode and the insulating layer at a location where the positive electrode and the negative electrode face each other.

More preferably, the battery is a lithium secondary battery, and the foreign object is inserted onto the electrode inside the electrode group such that $a+b=d$ where a represents the thickness of an active material layer of the positive electrode, b represents the thickness of the insulating layer, and d represents the length of the foreign object in the direction perpendicular to the surface of the electrode.

More preferably, the foreign object is inserted onto the electrode inside the electrode group such that $2b+c+e=d$ where b represents the thickness of the insulating layer, c represents the thickness of the positive electrode, d represents the length of the foreign object in the direction perpendicular to the surface of the electrode, and e represents the thickness of the negative electrode plate.

The internal short-circuit causing method (b) is preferably performed by inserting a shape memory alloy or bimetal into a location inside the electrode group of the battery where the positive electrode and the negative electrode face each other, and heating or cooling the shape memory alloy or bimetal to deform it and locally crush the insulating layer.

The internal short-circuit causing method (c) is preferably performed by cutting a certain area of the insulating layer at a location where the positive electrode and the negative electrode face each other, and applying a pressure to the cut area.

More preferably, the insulating layer is cut before the electrode group is assembled.

More preferably, the insulating layer is cut after disassembling the assembled battery and taking out the electrode group from the housing, and the battery is reassembled after the cutting of the insulating layer.

More preferably, the electrode group is assembled with an insulating sheet placed on at least one face of the cut area of the insulating layer, and after the insulating sheet is pulled out of the resultant electrode group, a pressure is applied to the cut area.

In the internal short-circuit causing method (d), preferably, the battery that includes the positive electrode having an exposed part of the current-collecting terminal at an outermost part is a lithium secondary battery, and the internal short-circuit causing method (d) is performed by inserting a pressing member with a sharp edge until it reaches the exposed part of the current-collecting terminal while applying ultrasonic waves thereto, and further inserting the pressing member into the battery without applying the ultrasonic waves.

In the internal short-circuit causing method (e), preferably, the battery that includes the positive electrode having an exposed part of the current-collecting terminal at an outermost part is a lithium secondary battery, and the internal short-circuit causing method (e) is performed by cutting the exposed part of the current-collecting terminal of the positive electrode at the outermost part without causing a continuing short-circuit, and inserting a pressing member with a sharp edge into the cut part.

More preferably, the exposed part of the current-collecting terminal at the outermost part of the battery is cut by using an ultrasonic cutter.

In the internal short-circuit causing method (f), preferably, the battery is a battery including a wound-type electrode group, and the internal short-circuit causing method (f) is performed by inserting a pressing member with a sharp edge into a bottom of the battery.

In another embodiment, in the internal short-circuit causing method (f), preferably, the battery is a battery including a wound-type electrode group, and the internal short-circuit causing method (f) is performed by inserting a pressing member with a sharp edge into a substantially central part of a bottom of the battery slantwise relative to a winding axis of the electrode group.

In the internal short-circuit causing method (g), the battery is a battery including a laminated-type electrode group, and the internal short-circuit causing method (g) is performed by inserting a pressing member with a sharp edge into a side face of the battery.

The internal short-circuit causing method (h) is preferably performed by locally heating the outer face of the battery to a temperature equal to or higher than the melting point of the insulating layer to locally melt the insulating layer of the battery.

More preferably, the heating is performed by bringing a heat generator having a temperature equal to or higher than the melting point of the insulating layer close to the battery.

More preferably, the heat generator is a soldering iron.

More preferably, the outer face of the battery heated to a temperature equal to or higher than the melting point of the insulating layer is a connection area between the housing and the current-collecting terminal.

More preferably, the electrode group taken out of the housing of the assembled battery is locally heated.

More preferably, the battery is a lithium secondary battery including a positive electrode that has an exposed part of a current-collecting terminal at an outermost part; the electrode group is taken out of the housing of the assembled lithium secondary battery, the exposed part of the current-collecting terminal of the positive electrode is cut, and the electrode group is locally heated.

The present invention also provides a method for producing a battery whose safety has been identified by any one of the above-described methods for evaluating the safety of a battery upon an internal short-circuit.

The present invention also provides a method for producing a battery pack whose safety has been identified by any one of the above-described methods for evaluating the safety of a battery upon an internal short-circuit.

The present invention also provides a battery produced by the above-mentioned method for producing a battery.

The present invention also provides a battery pack produced by the above-mentioned method for producing a battery pack.

The present invention also provides a device for evaluating an internal short-circuit of a battery, including: pressure applying means for applying a pressure to at least a part of the battery; pressure controlling means for adjusting the pressure applied by the pressure applying means; battery information measuring means for measuring battery information; at least one short-circuit detecting means for determining whether or not an internal short-circuit has occurred by comparing a measurement result produced by the battery information measuring means with a reference value of an internal short-circuit, and for producing an internal short-circuit detection signal depending on a result of the determination; and at least one controlling means including a control circuit for producing a control signal depending on the detection signal from the short-circuit detecting means and a controller for detecting the control signal from the control circuit.

More preferably, the device for evaluating an internal short-circuit of a battery according to the present invention further includes ultrasonic wave generating means for applying ultrasonic waves to at least a part of the battery, and ultrasonic wave controlling means for controlling the ultrasonic wave generating means.

The present invention also provides a method for producing a battery whose safety has been identified by the above-mentioned device for evaluating an internal short-circuit of a battery.

The present invention also provides a method for producing a battery pack whose safety has been identified by the device for evaluating an internal short-circuit of a battery.

The present invention also provides a battery produced by the above-described method for producing a battery.

The present invention also provides a battery pack produced by the method for producing a battery pack.

Effects of the Invention

According to the present invention, by using a method for evaluating an internal short-circuit of a battery by causing a short-circuit at a desired location inside the battery, the safety of the battery under the internal short-circuit condition can be accurately evaluated. That is, unlike conventional nail penetration test methods, the evaluation results are not affected by the constitution, shape, etc., of the battery, and unlike crush tests, the test results do not vary. Further, by identifying the safety, the user can understand the safety level of the battery.

BEST MODE FOR CARRYING OUT THE INVENTION

Figure 1:
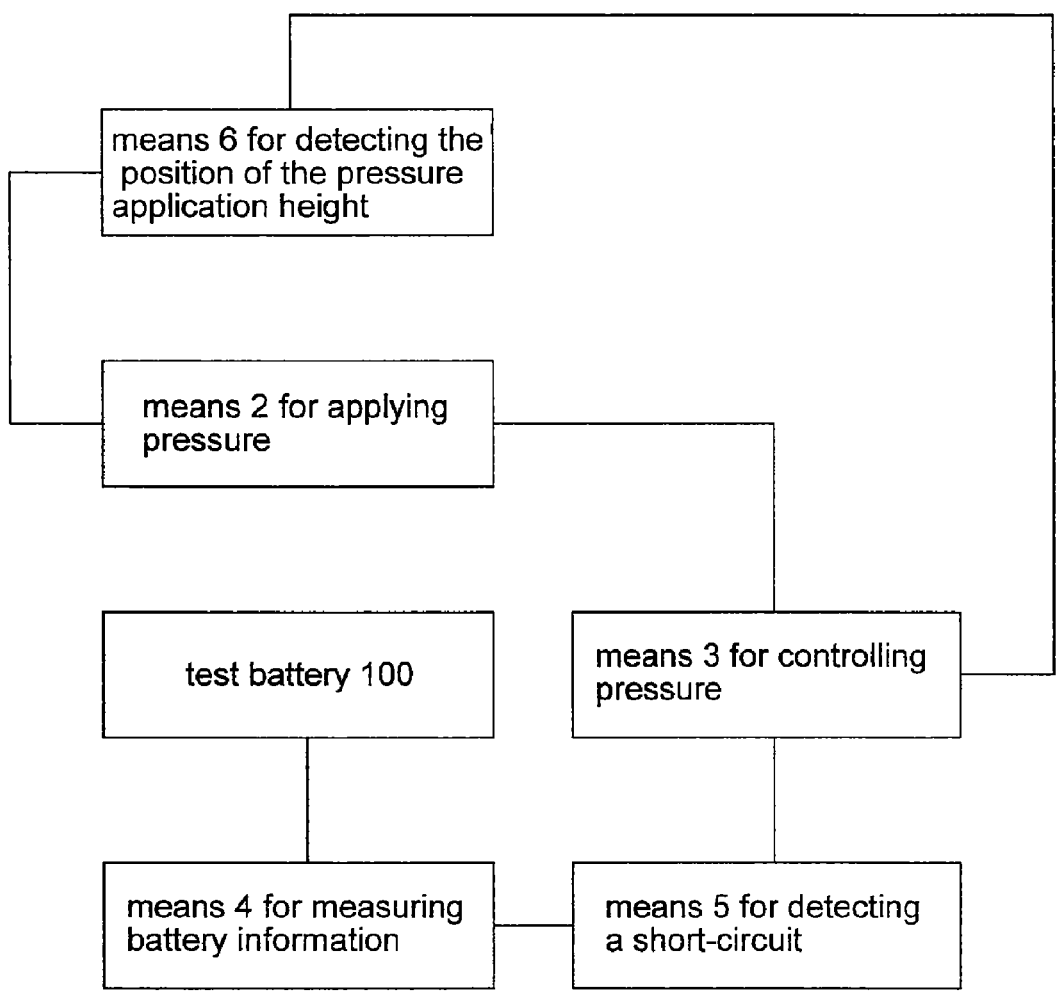
FIG. 1 is a block diagram showing the structure of a device for evaluating an internal short-circuit of a battery in an embodiment of the present invention.

The method for evaluating the safety of a battery under an internal short-circuit condition according to the present invention (hereinafter referred to as "evaluation method") utilizes an internal short-circuit causing method capable of causing a short-circuit at a desired location inside a battery. By using such an internal short-circuit evaluation method, the safety under the internal short-circuit condition can be accurately evaluated without being affected by the local constitution or structure of the battery.

Contrary to this, in nail penetration tests which are conventional internal short-circuit test methods, the locations of short-circuits are limited to an outermost part of a battery, and the evaluation results are therefore greatly affected by the constitution of the outermost part. For example, when an internal short-circuit occurs in an inner part of a battery, even if the battery has a large amount of heat, the amount of heat generated in a nail penetration test can be reduced by modifying the constitution of the outermost part of the battery. Hence, the safety under possible internal short-circuit conditions in the market, particularly during distribution and use, may not be evaluated accurately.

Further, in the present invention, by identifying the safety level of the battery determined by the above-mentioned evaluation method, optimum uses and application designs are possible. Examples of methods for specifying a safety level include a method of specifying in a commercial catalogue and a method of specifying on a battery or battery pack.

The evaluation method of the present invention is characterized by causing a short-circuit at a desired location inside a battery, and detecting the occurrence of the internal short-circuit by detecting battery information obtained from the battery or by visual inspection in order to evaluate the safety of the battery.

The battery evaluated by the evaluation method of the present invention includes: an electrode group including a positive electrode, a negative electrode, and an insulating layer for electrically insulating the positive and negative electrodes from each other, the positive and negative electrodes and the insulating layer being wound or laminated; an electrolyte; a housing for housing the electrode group and the electrolyte, the housing including an external terminal; and a current-collecting terminal for electrically connecting the electrode group and the external terminal.

In the evaluation method of the present invention, examples of internal short-circuit causing methods include the following methods (a) to (h).

(a) an internal short-circuit causing method comprising inserting a foreign object into the battery and applying a pressure to the battery;

(b) an internal short-circuit causing method comprising inserting a shape memory alloy or bimetal into the battery and heating or cooling the battery;

(c) an internal short-circuit causing method comprising removing a part of the insulating layer of the battery and applying a pressure to the removed part of the insulating layer;

(d) an internal short-circuit causing method for the battery that includes the positive electrode having an exposed part of the current-collecting terminal at an outermost part, the method comprising inserting a pressing member with a sharp edge until it reaches the exposed part of the current-collecting terminal while applying ultrasonic waves thereto, and further inserting the pressing member without applying the ultrasonic waves;

(e) an internal short-circuit causing method for the battery that includes the positive electrode having an exposed part of the current-collecting terminal at an outermost part, the method comprising cutting the exposed part of the current-collecting terminal of the positive electrode at the outermost part and inserting a pressing member with a sharp edge into the cut part;

(f) an internal short-circuit causing method comprising inserting a pressing member with a sharp edge into a bottom of the battery;

(g) an internal short-circuit causing method for the battery including a laminated-type electrode group, the method comprising inserting a pressing member with a sharp edge into a side face of the battery; and (h) an internal short-circuit causing method comprising heating an outer face of the battery to a temperature equal to or higher than the melting point of the insulating layer to melt the insulating layer of the battery.

Examples of battery information include battery voltage, battery temperature, sound produced by the battery, light produced by the battery, and internal pressure of the battery. In particular, battery voltage is preferable as battery information to detect an internal short-circuit, since it sensitively changes in the event of an internal short-circuit. Battery voltage can be detected, for example, by a voltmeter. More specifically, while varying the battery kind, structure, dimensions, etc., an internal short-circuit is caused at respective locations of a battery, and changes in voltage value are measured and recorded as data. According to the measuring method of the present invention, the location of an internal short-circuit can be identified. Thus, by referring to the recorded data, it is possible to properly determine whether or not an internal short-circuit has occurred and to detect the occurrence of an internal short-circuit. Battery temperature can be detected, for example, with a thermocouple. Sound and light produced by the battery can be detected, for example, with a sound sensor, a light sensor, etc. In the case of temperature, sound, and light, the occurrence of an internal short-circuit can also be detected by collecting data in advance.

The detection of an internal short-circuit by visual inspection is performed, for example, by taking photos or videos of internally short-circuited batteries in advance, and comparing them with a battery that is internally short-circuited by an internal short-circuit causing method included in the evaluation method of the present invention. Since an internally short-circuited battery that is, for example, in the state of heat runaway or producing smoke has a characteristic appearance, the occurrence of an internal short-circuit can be easily detected by visual inspection.

Safety is evaluated, for example, based on battery information obtained when the battery is internally short-circuited. For example, battery information upon an internal short-circuit is obtained with respect to each of the internal short-circuit causing methods, and battery information is obtained with respect to each internal short-circuit location of the battery. Then, the ranges of variation in battery voltage, battery temperature, etc. are obtained. These variation ranges can be utilized as safety evaluation criteria. According to the variation ranges, safety rank may be determined.

Also, safety rank may be determined by calculating the amount of heat generated due to an internal short-circuit from the variation range of battery voltage and battery internal resistance.

Also, evaluation may be made by internally short-circuiting a plurality of batteries produced by the same production method, calculating standard deviation from battery information obtained, and determining safety rank based on the standard deviation.

Also, the same evaluation may be made using batteries that have deteriorated with time, and the result may be used to determine recommended use period.

Also, ambient temperatures at which the amount of an increase in battery temperature due to an internal short-circuit is reduced to or below a certain value may be used as recommended use temperatures for safety.

Such safety rank may be indicated, for example, on the product surface of a battery or battery pack. An explanation on the safety rank may be given, for example, in the product catalogue, home page on the Internet, etc. When the battery information is information on battery temperature, it is easy to understand for ordinary consumers. Thus, this is preferable.

Next, the internal short-circuit causing methods (a) to (h) are more specifically described.

The internal short-circuit causing method (a) is preferably performed by inserting a foreign object into a location inside an electrode group of a battery where positive and negative electrodes face each other, and applying a pressure to the location into which the foreign object is inserted to locally crush the insulating layer and cause an internal short-circuit. Since the foreign object can be inserted into a desired location inside the battery, it is possible to freely select areas of the positive and negative electrodes that are to be short-circuited. Specifically, for example, the active material part (active material layer) of the positive electrode and the active material part (active material layer) of the negative electrode, or the current-collecting terminal of the positive electrode and the active material part of the negative electrode (negative electrode active material layer) can be selected. Also, by changing the shape, hardness, or size of the foreign object, the pressure applied to the location into which the foreign object is inserted, etc., the internal short-circuit to be caused can be controlled. Thus, the use of a foreign object is preferable. By inserting a foreign object into a desired location inside the battery, a situation in which a foreign object undesirably enters the location can be reproduced.

A preferable example of the internal short-circuit causing method (a) in another embodiment is a method of disassembling the battery, taking the electrode group out of the housing, inserting a foreign object into a location inside the electrode group where the positive electrode and the negative electrode face each other, reassembling, and applying a pressure. By inserting the foreign object after the fabrication of the battery, it is possible to avoid the occurrence of an internal short-circuit during a battery production process. Also, in inserting the foreign object, it is more preferable to place an insulating sheet and a foreign object in layers, reassembling the electrode group, pulling out the insulating sheet, and applying a pressure to cause a short-circuit. In this case, it is possible to prevent the occurrence of a short-circuit during the reassembling after the foreign object is placed. The insulating sheet is preferably made of a heat-resistant material.

The foreign object is preferably inserted into the battery before the electrolyte is injected to produce (assemble) the battery and reassemble the battery. By inserting the foreign object before the injection of the electrolyte, it is possible to make an evaluation while keeping the state of the battery produced, which is simple and preferable. Preferably, the foreign object inserted into the electrode group is electrochemically and chemically stable in the operating voltage range of the battery. For example, when the battery is a lithium secondary battery and a foreign object is inserted between the negative electrode and the insulating layer, the foreign object preferably contains Ni, Cu, stainless steel, or Fe. When a foreign object is inserted between the positive electrode and the insulating layer, the foreign object preferably contains Al or stainless steel.

Further, in performing the evaluation, it is preferable to stop the application of the pressure upon detecting the occurrence of an internal short-circuit. In this case, the location of the internal short-circuit can be limited to a local area. A change in short-circuit area results in a variation in the amount of heat generated, so that the evaluation accuracy of safety under an internal short-circuit condition decreases. Methods for detecting a short-circuit include detection of a drop in battery voltage caused by the short-circuit, a temperature change (mainly a temperature rise) caused by the short-circuit, sound or light produced by the short-circuit, etc.

In applying a pressure, it is preferable to apply a pressure at a constant speed or apply a constant pressure. In this case, the variation in test results can be reduced and accurate evaluation is possible. When a pressure is applied at a constant speed, the pressure applied until the insulating layer is crushed is released upon occurrence of a short-circuit, so that the pressure decreases. This pressure decrease may be used to detect the occurrence of a short-circuit. More specifically, for example, the occurrence of a short-circuit is detected by monitoring the pressure applied and detecting a pressure decrease, and the application of the pressure is stopped at this time. The pressure applied is preferably about $49 \times 10^5$ Pa (50 kg/cm$^2$) or less. If it exceeds about $49 \times 10^5$ Pa, the electrode group itself may become deformed, resulting in a variation in short-circuit area. Further, a short-circuit may occur in an area other than the location into which the foreign object is inserted, which is not preferable.

The foreign object inserted into the battery is preferably conductive. In the case of a conductive foreign object, a short-circuit occurs as soon as the foreign object crushes the insulating layer. It is thus possible to stably cause a short-circuit.

Also, the foreign object inserted into the electrode group preferably has an anisotropic shape. When the foreign object is anisotropic, it can promptly crush the insulating layer locally to cause a short-circuit without applying an excessive pressure upon the pressure application. When the foreign object is not anisotropic such as spherical, it crushes the electrode due to excessive pressure application and it is thus difficult to control the state of the short-circuit. When the foreign object is anisotropic, it is more preferable that the foreign object have a shape selected from the group consisting of a horseshoe-like shape, a cone, a pyramid, a cylinder (length/diameter=1.5), and a rectangular parallelepiped (the length of the longest side/the length of the other two sides=1.5). By using a foreign object having such a shape, it becomes possible to control the state of the short-circuit with high accuracy.

When the battery is a lithium secondary battery, the size of the foreign object inserted into the electrode group preferably satisfies a+b=d where a represents the thickness of an active material layer of the positive electrode, b represents the thickness of the insulating layer, and d represents the length of the foreign object in the direction perpendicular to the surface of the electrode. In the case a+b>d, when a foreign object is inserted between the active material layers of the positive and negative electrodes, a short-circuit occurs between the positive electrode mixture and the negative electrode mixture since the foreign object does not reach the current-collecting terminal of the positive electrode plate. However, if the foreign object is large enough to cause a short-circuit between the positive electrode current-collecting terminal and the negative electrode mixture, more Joule's heat is generated since the resistance of the positive electrode current-collecting terminal of the lithium secondary battery is lower than the resistance of the positive electrode active material layer. That is, when a+b>d, the safety under an internal short-circuit condition may be overestimated. It is therefore preferable that d=a+b.

Also, the foreign object inserted into the electrode group preferably satisfies 2b+c+e=d where d represents the length placed on an electrode in the direction perpendicular to the surface of the electrode, b represents the thickness of the insulating layer, c represents the thickness of the positive electrode, and e represents the thickness of the negative electrode. If the length d of the foreign object is greater than 2b+c+e, short-circuits through two layers may simultaneously occur in the direction perpendicular to the electrode plate. Due to the resulting local variation in the amount of heat generated, the evaluation accuracy of safety under an internal short-circuit may lower.

The internal short-circuit causing method (b) is performed, for example, by inserting a shape memory alloy or bimetal into a location inside the electrode group of the battery where the positive electrode and the negative electrode face each other, heating or cooling the shape memory alloy or bimetal, and deforming the shape memory alloy or bimetal to locally crush the insulating layer. The method (b) can also cause a short-circuit at a desired location inside the battery in the same manner as the method (a).

When a shape memory alloy is used, for example, a shape memory alloy that remembers a curved or a polygonal shape may be deformed into a linear shape and placed between the electrodes. In this state, the temperature is changed to a temperature at which the shape memory alloy regains the shape it remembers. Then, it deforms into a curved or a polygonal shape, thereby crushing the insulating layer to cause a short-circuit. Also, when a bimetal is used, for example, a linear bimetal may be inserted between the electrodes. In this state, the temperature is changed to a temperature at which the bimetal deforms due to a difference in expansion rate. Then, the bimetal deforms, thereby crushing the insulating layer to cause a short-circuit. Preferably, the shape memory alloy and bimetal change in shape at 80° C. or less at which there is no adverse effect on battery characteristics.

The short-cut causing method (c) is performed, for example, by cutting a certain area of the insulating layer of the battery where the positive electrode and the negative electrode face each other, and applying a pressure to the cut area.

The internal short-circuit causing method (c) can also cause a short-circuit at a desired location inside the battery. According to the internal short-circuit causing method (c), the cut area of the insulating layer and the short-circuit area can be determined freely, and the area is always constant. It thus becomes possible to control the state of the short-circuit with high accuracy, and accurately evaluate the safety under an internal short-circuit condition.

The insulating layer may be cut before the electrode group is produced (the electrode group is assembled).

Alternatively, after the finished battery is disassembled and the electrode group is taken out of the housing, the insulating layer inside the electrode group may be cut, followed by reassembling. Further, it is preferable to cut the insulating layer, place an insulating sheet over at least one face of the area where the insulating layer is cut in the thickness direction, reassembling the battery or electrode group therewith, pulling out the insulating sheet from the battery or electrode group, and applying a pressure to the cut area. In this case, it is possible to prevent a short-circuit during the assembling after the cutting.

In the internal short-circuit causing method (d), the battery is a lithium secondary battery including a positive electrode that has an exposed part of a current-collecting terminal at an outermost part, and a pressing member with a sharp edge is stuck into the battery. This method is performed, for example, by sticking the pressing member into the battery first while applying ultrasonic waves thereto and then without applying the ultrasonic waves. When a pressing member is stuck into a battery including a positive electrode that has an exposed part of a current-collecting terminal at an outermost part from outside, as in a conventional nail penetration test, a short-circuit occurs first between the current-collecting terminal of the positive electrode and a negative electrode. As described above, since a positive electrode current-collecting terminal (usually Al) has a significantly lower resistance than a positive electrode active material, most of the short-circuit current flows between the positive electrode current-collecting terminal and a negative electrode, and Joule's heat due to the short-circuit is generated at the exposed part of the current-collecting terminal, not at the positive electrode active material part having low thermal stability. It is thus not possible to accurately evaluate the safety under an internal short-circuit condition.

Contrary to this, in the internal short-circuit causing method (d), since the pressing member is stuck into the electrode group with ultrasonic waves being applied, a continuing short-circuit does not occur. Hence, by sticking while applying ultrasonic waves and sticking without applying the ultrasonic waves, a short-circuit can be caused at a desired location of the battery. For example, by sticking the pressing member into a desired location inside the electrode group while applying ultrasonic waves and then further sticking the pressing member a given distance without applying the ultrasonic waves, it is possible to freely select a location at which an internal short-circuit is caused. With respect to the frequency f of the ultrasonic waves, it is preferable that 20 kHz≦f≦100 kHz.

In the internal short-circuit causing method (d), preferably, the battery is a lithium secondary battery including a positive electrode that has an exposed part of a current-collecting terminal at an outermost part, and this method is performed by sticking a pressing member with a sharp edge into the battery until the pressing member reaches the exposed part of the current-collecting terminal while applying ultrasonic waves, and then further inserting the pressing member into the battery without applying the ultrasonic waves. At this time, for example, by suitably selecting the depth to which the pressing member is stuck into the battery, an internal short-circuit can be caused at a desired location of the battery.

Also, a preferable embodiment of the internal short-circuit causing method (e) is characterized in that the battery is a lithium secondary battery including a positive electrode that has an exposed part of a current-collecting terminal at an outermost part, that the exposed part of the current-collecting terminal of the positive electrode is cut without causing a continuing short-circuit, and that a pressing member with a sharp edge is stuck into the cut part (cut area). In this case, a short-circuit can be caused at a desired location of the battery without being affected by the current-collecting terminal of the positive electrode. The method for cutting the exposed part of the positive electrode current-collecting terminal is preferably a method that uses a tool capable of cutting with ultrasonic waves being applied, such as an ultrasonic cutter. In this case, it is possible to cut the exposed part of the positive electrode current-collecting terminal without causing a continuing short-circuit.

In the internal short-circuit causing method (f), for example, the battery is a wound-type battery including a wound-type electrode group, and this method is performed by sticking a pressing member with a sharp edge into the bottom of the battery. This can also cause a short-circuit at a desired location inside the battery. In the case of conventional nail penetration tests, the test results vary greatly depending on the constitution of the outermost part of the battery, as described above. However, by short-circuiting the bottom of the wound-type battery, it is possible to evaluate the safety of the battery under an internal short-circuit condition without being affected by the constitution of the outermost part. In this method, also, the pressing member is stuck in the direction parallel to the electrode surface. Also, this method allows very easy evaluation without applying any special process to the battery.

In the internal short-circuit causing method (f), preferably, the battery is a wound-type battery, and this method is performed by sticking a pressing member with a sharp edge into a substantially central part of the bottom of the battery slantwise relative to the winding axis of the electrode group. According to this method, a short-circuit can be caused at a desired location inside the battery, particularly at an innermost part of the electrodes, and the safety of the battery under an internal short-circuit condition can be evaluated without being greatly affected by the radiation of heat.

In the internal short-circuit causing method (g), for example, the battery is a laminated-type battery including a laminated-type electrode group, and this method is performed by sticking a pressing member with a sharp edge into a side face of the battery, i.e., in the direction parallel to the electrode surface. In the case of a laminated battery, when a nail is stuck in the direction perpendicular to the electrode surface, the occurrence of an internal short-circuit is significantly affected by the constitution of the outermost part. Hence, by sticking the pressing member into the side face of the battery, i.e., in the direction parallel to the electrode surface, a desired location inside the battery can be short-circuited and the safety of the battery under an internal short-circuit condition can be evaluated without being affected by the constitution or structure of the battery.

The internal short-circuit causing method (h) is performed by heating at least a part of the outer part of the battery to a temperature equal to or higher than the melting point of the insulating layer to locally melt the insulating layer. By this, a desired location inside the battery can be short-circuited. In this case, the location at which a short-circuit occurs can be defined by selecting an area to be heated.

Examples of the method for heating the battery include a method of irradiating the battery with a laser, and a method of bringing a heat generator having a temperature equal to or higher than the melting point of the insulating layer close to the battery. Among them, the method of bringing the heat generator to the battery is preferred. The heat generator is preferably a soldering iron. The temperature of heat generated by a soldering iron is about 350° C., which is higher than the melting point of polyolefin commonly used as the insulating layer, and the temperature is stable. Also, the shape at the edge thereof is narrow. It is thus possible to define the location of a short-circuit with good accuracy.

The outer part of the battery heated to a temperature equal to or higher than the melting point of the insulating layer is preferably a connection area between the housing and the current-collecting terminal. When this area is heated, heat is efficiently conducted through the current-collecting terminal. It is thus possible to cause a short-circuit in a more reliable manner while reducing the influence by the radiation of heat on the housing surface.

It is also possible to take the electrode group out of the housing of the assembled battery and heat the electrode group. This can also cause a short-circuit at a desired location. Further, when the battery is a lithium secondary battery including a positive electrode that has an exposed part of a current-collecting terminal at an outermost part, heating may be performed after taking the electrode group out of the housing of the assembled battery and cutting the exposed part of the current-collecting terminal. In this case, safety can be evaluated more accurately while eliminating the influence of the short-circuit between the positive electrode current-collecting terminal and the negative electrode, which is preferable.

Also, it is preferable to produce batteries by using a production method of batteries whose safety level about internal short-circuits has been identified by the evaluation method of the present invention. Specifically, it is preferable to identify the safety levels of batteries by the evaluation method of the present invention, select a battery having a desired safety level, and produce batteries according to the method by which the selected battery was produced. By producing batteries by the same production method, it is possible to assure that they have the same internal short-circuit safety level. Also, batteries produced by a production method of batteries whose safety level about internal short-circuits has been identified by the evaluation method of the present invention are preferable because they have almost the same internal short-circuit safety level.

Further, it is preferable to produce battery packs by using a production method of battery packs whose safety level about internal short-circuits has been identified by the evaluation method of the present invention. Specifically, it is preferable to identify the safety levels of batteries by the evaluation method of the present invention, select a battery pack having a desired safety level, and produce battery packs according to the method by which the selected battery pack was produced. By producing battery packs by the same production method, it is possible to assure that they have the same internal short-circuit safety level. Also, battery packs produced by a production method of battery packs whose safety level about internal short-circuits has been identified by the evaluation method of the present invention are preferable because they have almost the same internal short-circuit safety level.

[Battery Internal Short-circuit Evaluation Device]

Next, a device for evaluating an internal short-circuit of a battery according to the present invention (hereinafter referred to as "evaluation device") is a device capable of causing a short-circuit at a desired location of a battery and evaluating the safety of the battery under the internal short-circuit condition, as described above.

FIG. 1 is a block diagram showing the structure of an evaluation device 1 in one embodiment of the present invention. It should be noted that the following embodiment is an example of the evaluation device of the present invention and is not construed as limiting the technical range of the present invention.

The evaluation device 1 of the present invention includes means 2 for applying pressure, means 3 for controlling pressure, means 4 for measuring battery information, means 5 for detecting a short-circuit, and means 6 for detecting the position of the pressure application height. The means 2 for applying pressure, the means 3 for controlling pressure, the means 4 for measuring battery information, the means 5 for detecting a short-circuit, and the means 6 for detecting the position of the pressure application height are electrically connected, for example, as illustrated in FIG. 1.

The means 2 for applying pressure is provided for forcedly causing a short-circuit in a battery. For example, a pressure applying device is used as the means 2 for applying pressure. The pressure applying device is not particularly limited if it is capable of applying a pressure to a battery. Examples which may be used include pressure applying devices of screw type using a servomotor, post guide screw type, pendulum type, lever type, crank type, mechanical press type, hydraulic press type, and air press type. The tip of the pressure applying device is equipped with a member such as a round bar, square bar, flat plate, or nail. This member is driven into a test battery 100 which has been subjected to a process, such as insertion of a foreign object or cutting of the insulating layer, in order to apply a pressure. For example, when the tip of the pressure applying device is equipped with a nail, an internal short-circuit test can be performed by sticking the tip of the nail into a predetermined position of the test battery 100. Also, when the tip of the pressure applying device is equipped with a round bar, square bar, flat plate, or the like, an internal short-circuit test can be performed by crushing the test battery 100 to cause a short-circuit between the positive electrode and the negative electrode inside the battery. A battery table, not shown, is disposed at a location which is near the means 2 for applying pressure and to which the means 2 for applying pressure can apply a pressure, and the test battery 100 is placed thereon.

The means 3 for controlling pressure adjusts the pressure applied by the means 2 for applying pressure and starts/stops the application of the pressure, while receiving the detection result of the position of the means 2 for applying pressure by the means 6 for detecting the position of the pressure application height. The means 3 for controlling pressure is mainly controlled by the control signal sent from the means 5 for detecting a short-circuit which will be described later. For example, when the means 3 for controlling pressure receives from the means 5 for detecting a short-circuit a control signal that requests that the application of the pressure be stopped due to the occurrence of a short-circuit, it stops the application of the pressure by the means 2 for applying pressure. When the means 3 for controlling pressure receives the control signal from the means 5 for detecting a short-circuit, it may stop the application of the pressure by the means 2 for applying pressure after allowing the application of the pressure to continue until a certain depth is reached, depending on the detection result by the means 6 for detecting the position of the pressure application height. Further, the means 3 for controlling pressure may have the function of transferring the detection result by the means 6 for detecting the position of the pressure application height to the means 5 for detecting a short-circuit. In this case, the means 5 for detecting a short-circuit may be configured to detect the occurrence of a short-circuit and control the application of the pressure until a certain depth is reached after the detection. The means 3 for controlling pressure can be, for example, a process circuit including a microcomputer with a central processing unit (CPU), a memory, and the like.

The means 4 for measuring battery information, for example, measures the battery information of the test battery 100 that is under pressure by the means 2 for applying pressure and sends the measurement result to the means 5 for detecting a short-circuit. Examples of battery information include battery voltage, battery temperature, and pressure inside the battery. In particular, battery voltage changes sensitively when an internal short-circuit occurs, and it is thus preferable as battery information for detecting an internal short-circuit. The means 4 for measuring battery information can be, for example, a voltmeter, thermometer, manometer, thermocouple, thermoviewer, or calorimeter.

The means 5 for detecting a short-circuit is a circuit including a short-circuit detection unit and a control means. The circuit may be, for example, a process circuit including a microcomputer with a central processing unit (CPU), a memory, and the like.

The short-circuit detection unit detects the presence or absence of an internal short-circuit, for example, by comparing the measurement result sent from the means 4 for measuring battery information with a reference value of each battery information item to make a determination. The reference value is a value for determining the presence or absence of a short-circuit. When the value of a battery information item is different from a reference value, it is determined that an internal short-circuit has occurred. For example, the reference value of each battery information item is stored in a memory in advance and read from the memory to make a comparison and determination. A known memory device can be used as the memory, and examples include read only memory (ROM), random access memory (RAM), hard disk drive (HDD), and the like. When the short-circuit detection unit detects the occurrence of an internal short-circuit, it sends a detection signal to the control means. It should be noted that one or more short-circuit detection units may be provided. For example, a short-circuit detecting unit may be provided for each of battery information items. Alternatively, with the order of priority assigned to battery information items, one short-circuit detection unit may be used to make a comparison and determine the presence or absence of an internal short-circuit.

The control means includes a control circuit that sends a control signal depending on the detection signal from the short-circuit detection unit and a controller that detects the control signal from the control circuit. Alternatively, the control means may include only the control circuit. For example, when the control means receives a detection signal of an internal short-circuit from the short-circuit detection unit, it sends a control signal to the means 3 for controlling pressure. Upon receiving the signal, the means 3 for controlling pressure stops the application of the pressure to terminate the evaluation. It should be noted that the control signal is sent at a given time relative to the time of detection of the occurrence of an internal short-circuit. The control means may send a control signal immediately after receiving the detection signal from the short-circuit detection unit. Also, it may send a control signal after a given time lag by using a timer. When the control means receives a detection result of the positional information of the means 2 for applying pressure from the means 6 for detecting the position of the pressure application height, that is described below, via the means 3 for controlling pressure, it may send to the means 3 for controlling pressure a control signal that requests that the means 2 for applying pressure be stopped after the application of the pressure is continued until a certain depth is reached after the detection of a short-circuit.

The means 6 for detecting the position of the pressure application height detects positional information of the means 2 for applying pressure and sends the detection result to the means 3 for controlling pressure. Also, it may send the detection result directly to the means 5 for detecting a short-circuit. For example, various sensors can be used as the means for detecting the position of the pressure application height.

In the evaluation device 1 of the present invention, for example, the test battery 100 is placed at a predetermined position, and the control means of the means 5 for detecting a short-circuit sends a control signal to the means 3 for controlling pressure to actuate the means 2 for applying pressure, thereby applying a pressure to the test battery 100. During the pressure application, battery information is measured by the means 4 for measuring battery information, and the measurement result is sent to the means 5 for detecting a short-circuit. The means 5 for detecting a short-circuit compares the measurement result by the means 4 for measuring battery information with a reference value to detect the presence or absence of an internal short-circuit. When the means 5 for detecting a short-circuit detects the occurrence of an internal short-circuit, it sends a control signal to the means 3 for controlling pressure to stop the application of the pressure by the means 2 for applying pressure. In this way, the occurrence of a short-circuit is detected and the safety of a battery can be accurately evaluated.

With respect to evaluation criteria of battery safety in this short-circuit evaluation method, the amount of an increase in battery temperature may be evaluated by using a thermocouple, a thermoviewer, etc., or the amount of heat generated may be measured by using a calorimeter, etc. Such devices may be included in the means 4 for measuring battery information.

Figure 2:
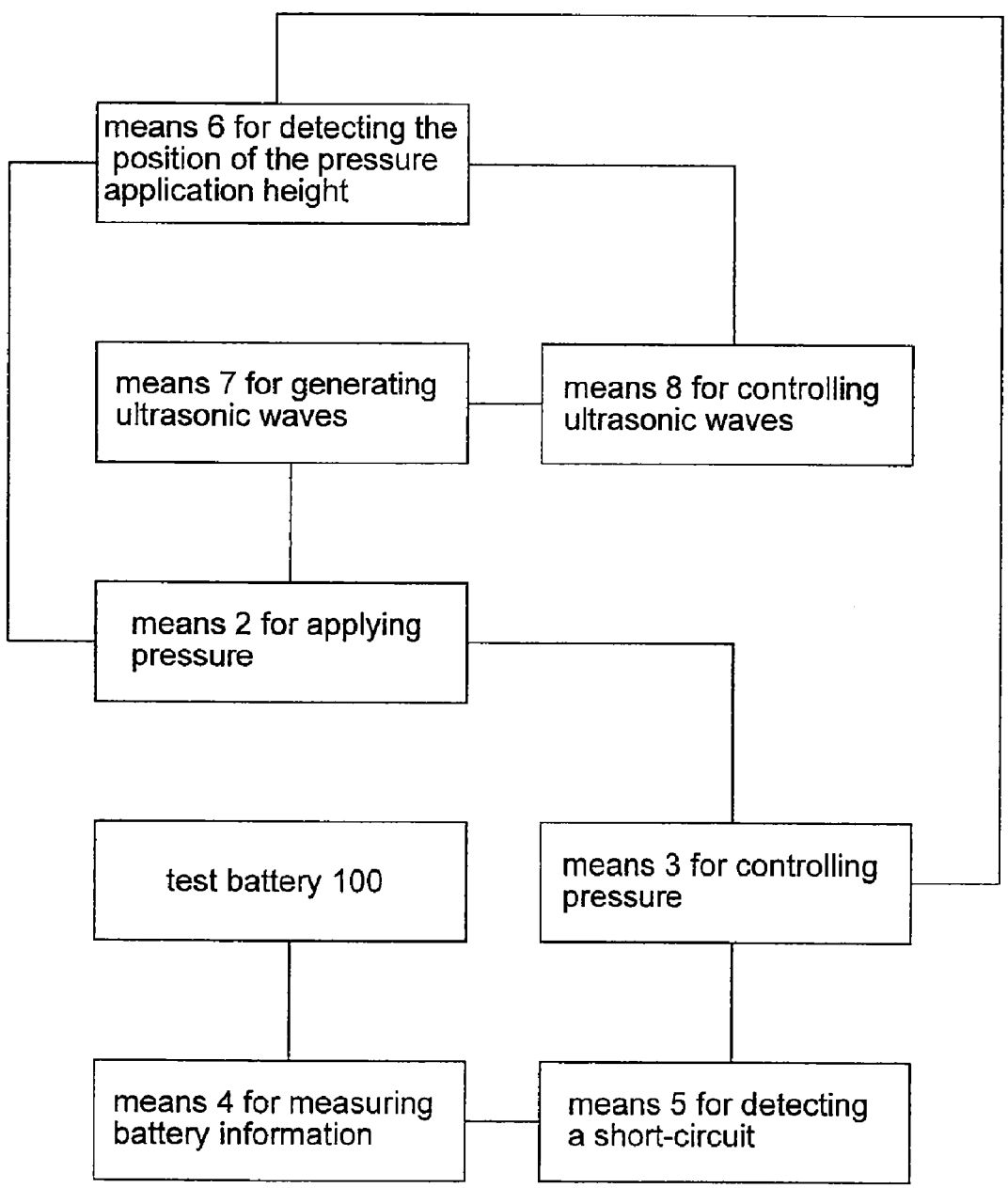
FIG. 2 is a block diagram showing the structure of a device for evaluating an internal short-circuit of a battery in an embodiment of the present invention.

FIG. 2 is a block diagram showing the structure of an evaluation device 1a in another embodiment of the present invention. The evaluation device 1a is similar to the evaluation device 1 and the components equivalent thereto are thus given the same reference characters without providing explanation. The evaluation device 1a is characterized by including means 7 for generating ultrasonic waves and means 8 for controlling ultrasonic waves, and the other components thereof are the same as those of the evaluation device 1.

The means 7 for generating ultrasonic waves produces ultrasonic waves and applies the ultrasonic waves to the means 2 for applying pressure. To start an evaluation, first, the means 8 for controlling ultrasonic waves actuates the means 7 for generating ultrasonic waves to apply ultrasonic waves to the means 2 for applying pressure. Subsequently, while the means 3 for controlling pressure receives a signal from the means 6 for detecting the position of the pressure application height, it lowers the means 2 for applying pressure to a predetermined depth, so that the means 2 for applying pressure is inserted into a battery without causing a continuing short-circuit. When the insertion of the means 2 for applying pressure into a predetermined position inside the battery is confirmed, for example, by a sensor, the means 8 for controlling ultrasonic waves stops the ultrasonic waves. Thereafter, the means 2 for applying pressure is further lowered as described above to cause an internal short-circuit in the battery.

A common ultrasonic wave generator can be used as the means 7 for generating ultrasonic waves. Also, the means 8 for controlling ultrasonic waves has the same constitution as the control means of the evaluation device 1 and controls the generation of ultrasonic waves by the means 7 for generating ultrasonic waves. The control means of the evaluation device 1a may be provided with the function of the means 8 for controlling ultrasonic waves.

As described above, by using the evaluation devices 1 and 1a of the present invention, the safety of a battery under an internal short-circuit condition can be accurately evaluated.

It is preferable to produce batteries by using a production method of batteries whose safety level about internal short-circuits has been identified by the above-described internal short-circuit evaluation device. That is, various battery production methods are known, and the safety level of batteries produced by respective production methods can be evaluated by using the internal short-circuit evaluation device of the present invention. Also, batteries obtained by one production method have the same safety level. Hence, by producing batteries by the same production method of batteries whose safety level has been identified, it is possible to assure that they have the same safety level about internal short-circuits. Also, certain safety levels are required according to the use of batteries. If the safety levels of respective production methods are accurately evaluated, it is possible to select a production method according to the use and produce batteries having a desired safety level.

In the present specification, identifying the safety level about internal short-circuits means evaluating the safety level of a battery under an internal short-circuit condition by the internal short-circuit evaluation method or internal short-circuit evaluation device of the present invention.

Further, it is preferable to produce battery packs by using a production method of battery packs whose safety level about internal short-circuits has been identified by the internal short-circuit evaluation device. In the same manner as batteries, the safety levels of battery packs obtained by various known production methods are evaluated in advance by using the internal short-circuit evaluation device of the present invention. Also, battery packs obtained by one production method have the same safety level. Hence, by producing battery packs by the same production method of battery packs whose safety level has been identified, it is possible to assure that they have the same safety level about internal short-circuits. Also, certain safety levels are required according to the use of battery packs. If the safety levels of respective production methods are accurately evaluated, it is possible to select a production method according to the use and produce battery packs having a desired safety level.

Batteries are preferably produced by a production method of batteries whose safety level about internal short-circuits has been identified by the internal short-circuit evaluation device. In this case, it is possible to assure that the batteries have the same internal short-circuit safety level.

This applies to battery packs. That is, battery packs are preferably produced by a production method of battery packs whose safety level about internal short-circuits has been identified by the internal short-circuit evaluation device. In this case, it is possible to assure that the battery packs have the same internal short-circuit safety level.

The above-described battery evaluation device of the present invention is applicable, for example, to primary batteries such as manganese dry batteries, alkaline dry batteries, and lithium primary batteries, and secondary batteries such as lead-acid batteries, nickel cadmium storage batteries, nickel metal-hydride batteries, and lithium secondary batteries, without being limited to specific battery types.

The use of the battery internal short-circuit evaluation method and battery internal short-circuit evaluation device of the present invention permits accurate evaluation of safety under internal short-circuit conditions. It is thus possible to supply highly reliable batteries, which is commercially useful.

EXAMPLES

The method for evaluating an internal short-circuit of a battery according to the present invention is hereinafter described specifically by way of Examples.

Example 1

Production of Battery

A cylindrical lithium secondary battery was produced in the following manner as a battery to be subjected to a safety evaluation under an internal short-circuit condition.
(1) Preparation of Positive Electrode A positive electrode mixture paste was prepared by stirring 3 kg of nickel manganese cobalt lithium oxide ($LiNi_{1/3}Mn_{1/3}Co_{1/3}O_2$) powder (median diameter 15 μm) serving as a positive electrode active material, 1 kg of N-methyl-2-pyrrolidone (hereinafter "NMP") solution (trade name: #1320, available from Kureha Corporation) containing 12% by weight of polyvinylidene fluoride (hereinafter "PVDF") serving as a binder, 90 g of acetylene black serving as a conductive agent, and a suitable amount of NMP dispersion medium with a double-arm kneader. The positive electrode mixture paste was applied onto both sides of a belt-like positive electrode current-collecting terminal made of a 20-μm-thick aluminum foil. The applied positive electrode mixture paste was dried and rolled with rolling rolls to form positive electrode active material layers, so that the thickness of the active material layer was 180 μm. The electrode obtained was cut to a width (56 mm) such that it was capable of being inserted into a cylindrical housing (diameter 18 mm, height 65 mm, internal diameter 17.85 mm). In this way, a positive electrode was obtained.

It should be noted that the part of the current-collecting terminal corresponding to the innermost part of the electrode group was provided with an exposed part, to which an aluminum connection terminal was welded.
(2) Preparation of Negative Electrode A A negative electrode mixture paste was prepared by stirring 3 kg of artificial graphite powder (median diameter 20 μm) serving as a negative electrode active material, 75 g of an aqueous dispersion (trade name: BM-400B, available from Zeon Corporation) containing 40% by weight of modified styrene butadiene rubber particle serving as a binder, 30 g of carboxymethyl cellulose (CMC) serving as a thickener, and a suitable amount of water serving as a dispersion medium with a double-arm kneader. The negative electrode mixture paste was applied onto both sides of a belt-like negative electrode current-collecting terminal made of a 20-μm-thick copper foil. The applied negative electrode mixture paste was dried and rolled with rolling rolls to form negative electrode active material layers, so that the thickness of the active material layer was 180 μm. The electrode plate obtained was cut to a width (57.5 mm) such that it was capable of being inserted into the housing. In this way, a negative electrode was obtained. It should be noted that the part of the current-collecting terminal corresponding to the outermost part of the electrode group was provided with an exposed part having a length of about one turn, and a nickel connection terminal was welded to the end thereof. This was designated as a negative electrode plate A.

(3) Production of Negative Electrode B

A paste for forming a porous heat-resistant layer was prepared by stirring 970 g of alumina with a median diameter of 0.3 μm (insulating filler), 375 g of NMP solution (trade name: BM-720H, available from Zeon Corporation) containing 8% by weight of modified polyacrylonitrile rubber (binder), and a suitable amount of NMP with a double-arm kneader. This paste was applied onto the whole surface of each negative electrode active material layer of the negative electrode A and dried at 120° C. in a vacuum for 10 hours to form a porous heat-resistant layer with a thickness of 0.5 μm. The porosity of the porous heat-resistant layer was 48%. The porosity was calculated from the thickness of the porous heat-resistant layer as determined by taking an SEM photo of its cross-section, the amount of alumina present in the porous heat-resistant layer per unit area as determined by fluorescence X-ray analysis, the true specific gravities of alumina and the binder, and the weight ratio of alumina to the binder. The negative electrode plate produced in the above manner was designated as a negative electrode plate B.

(4) Fabrication of Battery

The positive electrode and the negative electrode were wound together with a 20-μm-thick polyethylene insulating layer (trade name: Hipore, available from Asahi Kasei Corporation) interposed therebetween, to form an electrode group. The electrode group was inserted into a nickel-plated iron cylindrical housing (diameter 18 mm, height 65 mm, internal diameter 17.85 mm), and 5.0 g of an electrolyte was injected into the housing. The opening of the housing was sealed with a cover, to complete a lithium secondary battery with a capacity of 2400 mAh. The electrolyte used was prepared by dissolving $LiPF_6$ at a concentration of 1 mol/L in a solvent mixture of ethylene carbonate (EC), dimethyl carbonate (DMC), and ethyl methyl carbonate (EMC). The volume ratio of EC/DMC/EMC in the solvent mixture was 1:1:1. To the electrolyte was added 3% by weight of vinylene carbonate (VC).

In the manner as described above, 20 batteries A having the negative electrode A and 20 batteries B having the negative electrode B were produced. First, each battery was preliminarily charged and discharged twice and then charged to 4.1 V at a current value of 400 mA. Subsequently, it was stored in an environment at 45° C. for 7 days and then charged under the following conditions. After the charge, the 20 batteries A and the 20 batteries B were evaluated for their internal short-circuit safety.

Constant current charge: current value 1500 mA/end of charge voltage 4.25 V

Constant voltage charge: charge voltage 4.25 V/end of charge current 100 mA (Evaluation Method of Internal Short-Circuit Safety)

The charged battery A was disassembled in a dry air environment and the electrode group was taken out. The outermost part thereof was unwound a little. A horseshoe-shaped Ni plate with a width of 200 μm, a thickness of 300 μm, and a length of 3 mm was placed between the negative electrode and the insulating layer where the positive electrode active material layer and the negative electrode active material layer faced each other. At this time, the length (height) in the direction perpendicular to the electrode surface is 200 μm.

Figure 3:
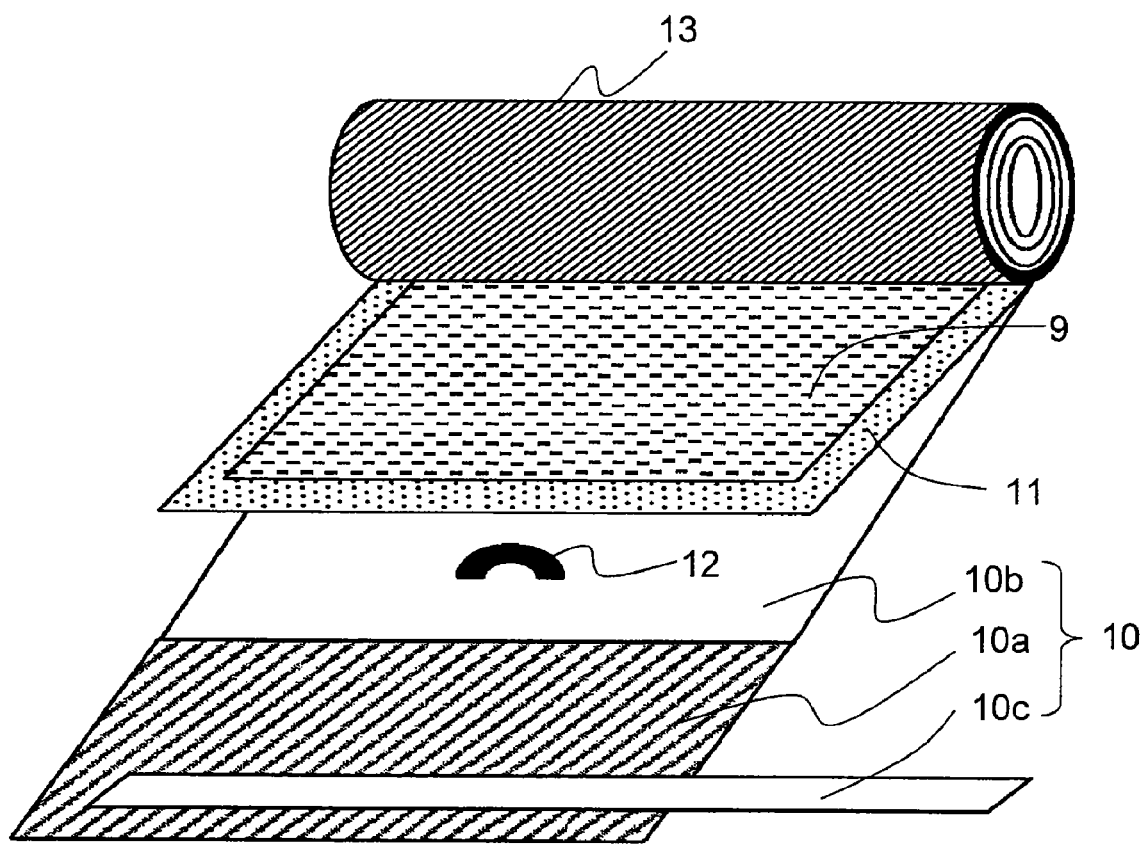
FIG. 3 is a perspective view which is intended to describe a method for evaluating an internal short-circuit of a battery in Example 1.

FIG. 3 is a schematic view of the electrode group. In FIG. 3, reference number 9 represents the positive electrode. Also, reference number 10 represents the negative electrode, which includes a negative electrode active material 10a, an exposed part of a negative electrode current-collecting terminal 10b, and a negative electrode connection terminal 10c. Further, reference number 11 represents the insulating layer, 12 represents the foreign object, and 13 represents the electrode group.

Thereafter, the electrode group was wound again, sealed, placed in a constant temperature oven at 60° C., and kept until the battery temperature reached 60° C. Then, a pressure was applied to the area of the electrode group into which the foreign object was inserted by using a dome-shaped pressing member of φ6 mm. With respect to the pressure application conditions, the speed was set constant at 1 mm/s and the maximum pressure was set to 50 $kg/cm^2$. At the instant when the battery voltage reached 4.0 V or less due to a short-circuit, the short-circuit was stopped. Besides the measurement of the battery voltage, the battery surface was measured with a thermocouple, and the amount of battery temperature increase (° C.) in 5 seconds after the occurrence of the short-circuit was evaluated in terms of the average value. Also, 10 batteries were measured in the same manner, and the standard deviation of battery temperature increase was obtained.

Example 2

A battery was produced in the same manner as in Example 1, except that the outermost part of the positive electrode current-collecting terminal of the battery was provided with an exposed part having a length of about one turn, and evaluated in the same manner.

Comparative Example 1

A battery A was produced and charged (finally charged to a charge voltage of 4.25 V at a constant voltage) in the same manner as in Example 1 and evaluated as follows. The battery was placed in a 60° C. constant temperature oven without disassembling, and kept until the battery temperature reached 60° C. An iron nail (φ3 mm) was used as the pressing member, and this nail was stuck into the electrode group. With respect to the pressure application conditions, the speed was set constant at 1 mm/s and the maximum pressure was set to 200 $kg/cm^2$. After the battery voltage reached 4.0 V or less due to a short-circuit, the nail was further stuck 200 μm and stopped. Besides the measurement of the battery voltage, the battery surface was measured with a thermocouple, and the amount of battery temperature increase in 5 seconds after the occurrence of the short-circuit was evaluated in terms of the average value. Also, 10 batteries were measured in the same manner, and the standard deviation of battery temperature increase was obtained.

Comparative Example 2

Evaluation was made in the same manner as in Comparative Example 1 except for the use of a battery A that was produced in the same manner as in Example 2 and charged in the same manner as in Example 1 (finally charged to a charge voltage of 4.25 V at a constant voltage).

Example 3

Except that the height of the foreign object inserted in the electrode group was changed to 50 μm, a battery A was produced and evaluated in the same manner as in Example 2.

Example 4

Except that the height of the foreign object inserted in the electrode group was changed to 500 µm, a battery A was produced and evaluated in the same manner as in Example 2.

Table 1 shows the evaluation results of Examples 1 to 4 and Comparative Examples 1 and 2.

TABLE 1

|  | Evaluation method of internal short-circuit | Exposed part of outermost positive electrode current-collecting terminal | Height of foreign object * (µm) | Amount of battery temperature increase | |
|---|---|---|---|---|---|
|  |  |  |  | Average (° C.) | Standard deviation |
| Example 1 | Insertion of foreign object | Absent | 200 | 36 | 1.82 |
| Example 2 | Insertion of foreign object | Present | 200 | 35 | 2.03 |
| Comparative Example 1 | Nail penetration | Absent | 200 | 41 | 1.83 |
| Comparative Example 2 | Nail penetration | Present | 200 | 12 | 1.35 |
| Example 3 | Insertion of foreign object | Present | 50 | 2 | 0.95 |
| Example 4 | Insertion of foreign object | Present | 500 | 39 | 6.88 |

* Depth of short-circuit in the case of nail penetration

In Examples 1 and 2, the internal short-circuit was caused by inserting the foreign object into the electrode group and applying the pressure. In this case, their batteries exhibited similar temperature increases irrespective of the constitution of the outermost part of the battery. Also, they exhibited small variations in measurement.

On the other hand, in Comparative Examples 1 and 2, the short-circuit was caused by sticking the nail from outside the battery. In this case, the variation in battery temperature increase was small, but there was a significantly large difference in battery voltage increase after the short-circuit between the presence and the absence of exposure of the outermost positive electrode current-collecting terminal. In particular, in Comparative Example 2, the positive electrode current-collecting terminal was provided with the exposed part, and thus, the battery temperature increase was significantly small in comparison with the cases where the short-circuit was caused by inserting the foreign object. That is, it is clear that the internal short-circuit evaluation method by nail penetration may overestimate safety depending on the local constitution of the battery. On the other hand, it is also clear that the evaluation method by foreign object insertion can accurately estimate the safety under an internal short-circuit condition without being affected by the local constitution of the battery.

Also, in Example 3, the foreign object having a height of 50 µm was inserted. In this case, there was a small variation in evaluation results, but the battery temperature increase was smaller than that in Example 1. In Example 3, the height of the foreign object is less than the sum of the thickness (20 µm) of the insulating layer and the thickness (µm) of the positive electrode active material. Probably for this reason, a short-circuit occurs between the positive electrode active material and the negative electrode active material having significantly higher resistance than the current-collecting terminal, thereby producing little Joule's heat and resulting in a small battery temperature increase.

When the batteries of Examples 1 and 2 were disassembled after the evaluation, it was confirmed that in the battery of Example 1, the nickel foreign object reached the positive electrode current-collecting terminal, and that in the battery of Example 2, the nickel foreign object did not reach the positive electrode current-collecting terminal. This indicates that when the height of the foreign object inserted is too low, the safety may be overestimated, and that the preferable height of the conductive foreign object is at least the sum (100 µm) of the thickness (20 µm) of the insulating layer and the thickness (80 µm) of the positive electrode active material.

In Example 4, the conductive foreign object having a height of 500 µm was inserted. In this case, there was a large variation in evaluation results. This is probably because the height of the foreign object is greater than the sum (400 µm) of the thickness (180 µm) of active material of the positive electrode plate, the thickness (180 µm) of active material of the negative electrode plate, and the double (40 µm) of the thickness (20 µm) of the insulating layer. Hence, it is believed that a short-circuit through two layers occurred in some of the batteries, thereby resulting in a variation in the amount of heat produced. In fact, when the batteries after the evaluation were disassembled, it was confirmed that a short-circuit through two layers occurred in 3 batteries out of 10 batteries.

Example 5

Evaluation was made in the same manner as in Example 2 except that the pressure application conditions were changed to a constant speed of 1 mm/s and a constant pressure of 10 kg/cm² from the maximum pressure of 200 kg/cm².

Example 6

Evaluation was made in the same manner as in Example 2 except that the pressure application conditions were changed to a constant speed of 1 mm/s and a constant pressure of 50 kg/cm² from the maximum pressure of 200 kg/cm².

Example 7

Evaluation was made in the same manner as in Example 2 except that the pressure application conditions were changed to a constant speed of 1 mm/s and a constant pressure of 500 kg/cm² from the maximum pressure of 200 kg/cm². Table 2 shows the evaluation results of Examples 5 to 7.

TABLE 2

| Example | Evaluation method of internal short-circuit | Exposed part of outermost positive electrode current-collecting terminal | Height of foreign object * (μm) | Pressure applied (kg/cm²) | Battery temperature increase | |
|---|---|---|---|---|---|---|
| | | | | | Average (° C.) | Standard deviation |
| 6 | Insertion of foreign object | Present | 200 | 10 | 37 | 1.91 |
| 7 | Insertion of foreign object | Present | 200 | 50 | 36 | 1.78 |
| 8 | Insertion of foreign object | Present | 200 | 500 | 42 | 5.36 |

In Examples 5 and 6 in which the pressure applied was 50 kg/cm² or less, there was a small variation in battery temperature increase in the test. However, in Example 7 of greater than 50 kg/cm², there was a large variation. This is probably because the pressure applied was too large and thus the area of the short-circuit was not stable.

Example 8

Figure 4:
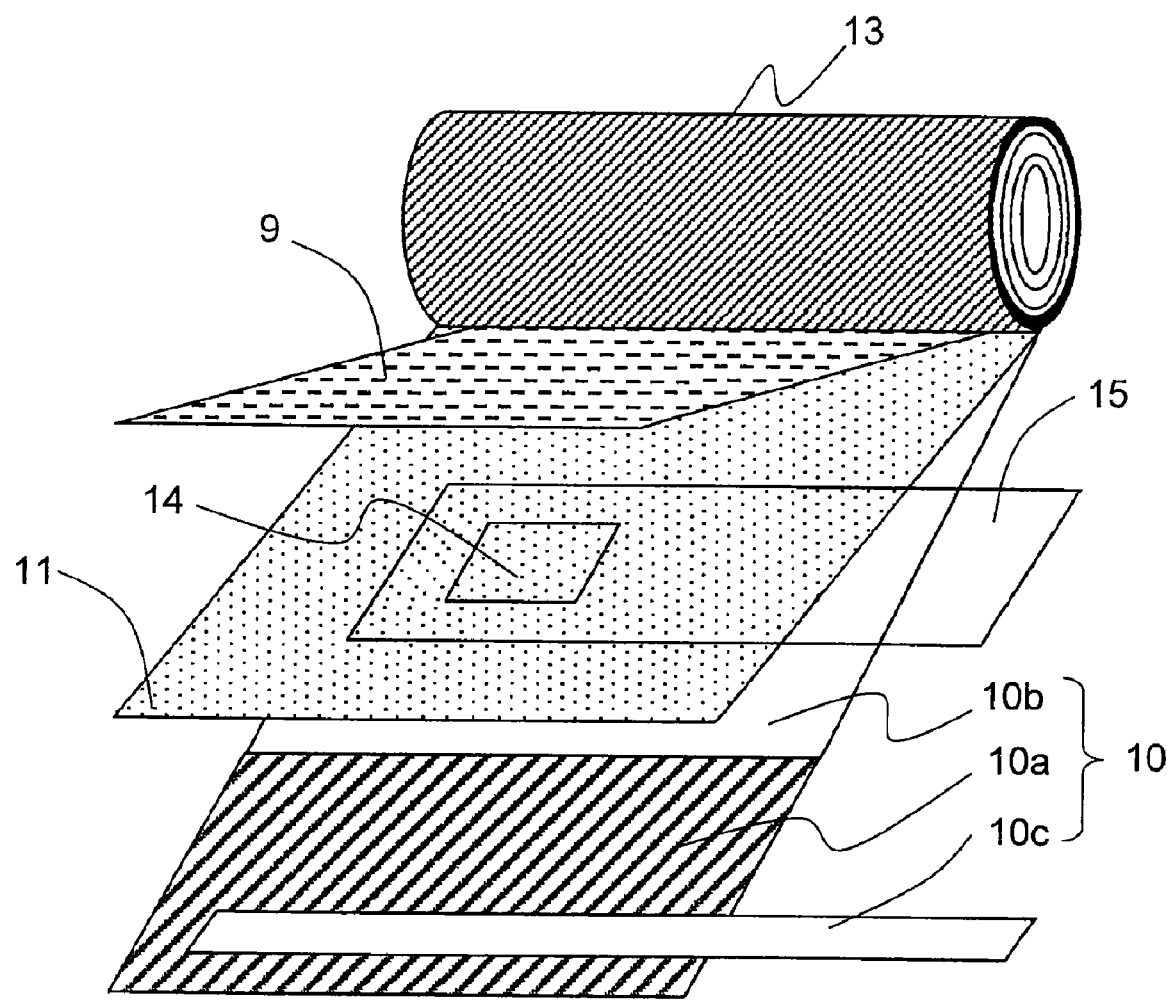
FIG. 4 is a perspective view which is intended to describe a method for evaluating an internal short-circuit of a battery in Example 8.

A battery A was produced in the same manner as in Example 1 and evaluated as follows. The battery charged in the same manner as in Example 1 was disassembled in a dry air environment and the electrode group was taken out. The outermost part thereof was unwound a little. At a location where the positive electrode active material layer and the negative electrode active material layer faced each other, a part of the insulating layer in the center of the width direction was cut in the shape of a square of 1 cm×1 cm. Subsequently, a 40-μm-thick PET sheet of 2 cm×8 cm was placed over the cut part such that its end protruded in the width direction of the electrode group. FIG. 4 is a schematic view of the electrode group. In FIG. 4, reference number 14 represents the cut part of the insulating layer and reference number 15 represents the PET sheet. The other components are the same as those in FIG. 3.

Thereafter, the electrode group was wound again, sealed, placed in a 60° C. constant temperature oven, and kept until the battery temperature reached 60° C. The PET sheet was pulled out and a pressure was applied to the electrode group by using a pressing member of a 1.5-cm square. With respect to the pressure application conditions, the speed was set constant at 1 mm/s and the maximum pressure was set to 50 kg/cm². At the instant when the battery voltage reached 4.0 V or less due to a short-circuit, the short-circuit was stopped.

Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

Example 9

A battery A was produced in the same manner as in Example 2 and evaluated as follows. The battery charged in the same manner as in Example 1 was disassembled in a dry air environment and the electrode group was taken out. The outermost part thereof was unwound a little. At a location where the positive electrode active material layer and the negative electrode active material layer faced each other, a part of the insulating layer in the center of the width direction was cut in the shape of a square of 1 cm×1 cm. Subsequently, a 40-μm-thick PET sheet of 2 cm×8 cm was placed over the cut part such that its end protruded in the width direction of the electrode group. FIG. 4 is a schematic view of the electrode group.

Thereafter, the electrode group was wound again, sealed, placed in a 60° C. constant temperature oven, and kept until the battery temperature reached 60° C. The PET sheet was pulled out and a pressure was applied to the electrode group by using a pressing member of a 1.5-cm square. With respect to the pressure application conditions, the speed was set constant at 1 μm/s and the maximum pressure was set to 50 kg/cm². At the instant when the battery voltage reached 4.0 V or less due to a short-circuit, the short-circuit was stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

Example 10

A battery A was produced in the same manner as in Example 1 and evaluated as follows. The battery charged in the same manner as in Example 1 was placed in a 60° C. constant temperature oven without disassembling, and kept until the battery temperature reached 60° C. An iron nail (φ3 mm) was used as the pressing member. First, ultrasonic waves of 40 kHz were applied to the nail, and the nail was stuck into the electrode group. With respect to the pressure application conditions, the speed was set constant at 0.1 mm/s and the maximum pressure was set to 200 kg/cm². After the nail was stuck into a depth of 0.5 mm, the ultrasonic waves were stopped. Thereafter, a continuing voltage drop was not observed.

Further, with the ultrasonic waves being stopped, the nail was further stuck to cause a short-circuit. After the battery voltage reached 4.0 V or less, the nail was further stuck 200 μm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

Example 11

A battery A was produced in the same manner as in Example 2 and evaluated as follows. The battery charged in the same manner as in Example 1 was placed in a 60° C. constant temperature oven without disassembling, and kept until the battery temperature reached 60° C. An iron nail (φ3 mm) was used as the pressing member. First, ultrasonic waves of 40 kHz were applied to the nail, and the nail was stuck into the electrode group. With respect to the pressure application conditions, the speed was set constant at 0.1 mm/s and the maximum pressure was set to 200 kg/cm². After the nail was stuck into a depth of 0.5 mm, the ultrasonic waves were stopped. Thereafter, a continuing voltage drop was not observed.

Further, with the ultrasonic waves being stopped, the nail was further stuck to cause a short-circuit. After the battery voltage reached 4.0 V or less, the nail was further stuck 200 µm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

Example 12

A battery A was produced in the same manner as in Example 1 and evaluated as follows. The battery charged in the same manner as in Example 1 was placed in a 60° C. constant temperature oven without disassembling, and kept until the battery temperature reached 60° C. An iron nail (φ3 mm) was used as the pressing member and stuck into the center of radius of the bottom of the battery. After the battery voltage reached 4.0 V or less due to the occurrence of a short-circuit, the nail was further stuck 300 µm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

Example 13

A battery A was produced in the same manner as in Example 2 and evaluated as follows. The battery charged in the same manner as in Example 1 was placed in a 60° C. constant temperature oven without disassembling, and kept until the battery temperature reached 60° C. An iron nail (φ3 mm) was used as the pressing member and stuck into the center of radius of the bottom of the battery. After the battery voltage reached 4.0 V or less due to the occurrence of a short-circuit, the nail was further stuck 300 µm and stopped. Besides the measurement of the battery voltage, the battery surface was measured with a thermocouple, and the amount of battery temperature increase in 5 seconds after the occurrence of the short-circuit was evaluated. Also, 10 batteries were measured in the same manner, and the standard deviation of battery temperature increase was obtained.

Table 3 shows the evaluation results of Examples 8 to 13.

TABLE 3

| Example | Evaluation method of internal short-circuit | Exposed part of outermost positive electrode current-collecting terminal | Battery temperature increase Average (° C.) | Battery temperature increase Standard deviation |
|---|---|---|---|---|
| 8 | Cutting of insulating layer | Absent | 21 | 2.37 |
| 9 | Cutting of insulating layer | Present | 22 | 2.34 |
| 10 | Ultrasonic nail penetration | Absent | 45 | 3.28 |
| 11 | Ultrasonic nail penetration | Present | 48 | 3.12 |
| 12 | Nail penetration into battery bottom | Absent | 38 | 2.40 |
| 13 | Nail penetration into battery bottom | Present | 40 | 2.46 |

In Examples 8 and 9, the internal short-circuit was caused by partially cutting the insulating layer and applying the pressure. In Examples 10 and 11, the internal short-circuit was caused by sticking the nail into the inner part of the battery while applying the ultrasonic waves. In Examples 12 and 13, the internal short-circuit was caused by sticking the nail into the bottom of the battery. In all of these Examples, the batteries exhibited similar temperature increases irrespective of the constitution of the outermost part of the battery. Also, they exhibited small measurement variations.

(Specification of Safety Level)

The battery B was evaluated by the internal short-circuit safety evaluation method of Example 1. As a result, the average battery temperature increase was 4° C. The battery B, which has the ceramic porous film on the negative electrode surface, has an improved safety in an internal short-circuit condition. This is probably because even in the event of an internal short-circuit, the heat-resistant insulating film serves to prevent the expansion of the short-circuit area. Hence, the amount of Joule's heat generated by the short-circuit is small, so that the safety level of the battery is significantly improved.

In this way, by using the test methods of the present invention, the safety levels of batteries under internal short-circuit conditions could be clearly identified. Thus, in order to indicate suitable uses of batteries and design application devices, the safety levels of batteries or battery packs were specified by placing the following indications on the batteries, battery packs, catalogues specifying battery characteristics, etc.

Battery A "Internal short-circuit 60° C.—foreign object short-circuit 36° C." indicates that "the safety level under an internal short-circuit condition is that when an internal short-circuit is caused by a foreign object in a 60° C. environment, the temperature of the battery increases by 36° C.".

Battery B "Internal short-circuit 60° C.—foreign object short-circuit 4° C." indicates that "the safety level under an internal short-circuit condition is that when an internal short-circuit is caused by a foreign object in a 60° C. environment, the temperature of the battery increases by 4° C.".

The specification of safety levels is not limited to the above-described indication methods and various forms are possible. For example, in addition to numbers representing the test conditions or results, it is possible to employ symbols and characters according to predetermined standards.

INDUSTRIAL APPLICABILITY

The use of the battery internal short-circuit evaluation method and the battery internal short-circuit evaluation device according to the present invention enables accurate evaluation of safety under an internal short-circuit condition. It is thus possible to provide batteries having high reliability in terms of safety. It is particularly advantageous in terms of safety in all commercial processes such as storage process, distribution process, and use process by consumers.

The invention claimed is:

1. A method for evaluating the safety of a battery upon an internal short-circuit, the battery comprising: an electrode group comprising a positive electrode, a negative electrode, and an insulating layer for electrically insulating the positive and negative electrodes from each other, the positive electrode comprising a positive electrode active material layer and a positive electrode current collector, the negative electrode comprising a negative electrode active material layer and a negative electrode current collector, the positive and negative electrodes and the insulating layer being wound or laminated; an electrolyte; a housing for housing the electrode group and the electrolyte, the housing including an external terminal; and a current-collecting terminal for electrically connecting the electrode group and the external terminal, the method comprising:
causing an internal short-circuit in the battery and detecting the occurrence of the internal short-circuit by detecting battery information obtained from the battery or by visual inspection,
wherein the internal short circuit is caused by inserting a foreign object into a location inside the electrode group of the battery where the positive electrode and the negative electrode face each other from a direction parallel to a surface of the positive electrode or the negative electrode, and applying a pressure to the location into which the foreign object is inserted to locally crush either the insulating layer interposed between the positive electrode and the negative electrode or at least one selected from the positive electrode active material layer and the negative electrode active material layer, together with the insulating layer, and
the foreign object is present independently between the positive electrode and the negative electrode and is not joined to the positive electrode or the negative electrode.

2. The method for evaluating the safety of a battery upon an internal short-circuit in accordance with claim 1, wherein the battery information is the voltage of the battery, and the occurrence of the internal short-circuit is detected by detecting a decrease in the voltage of the battery.

3. The method for evaluating the safety of a battery upon an internal short-circuit in accordance with claim 1, wherein the battery information is the temperature of the battery, and the occurrence of the internal short-circuit is detected by detecting a change in the temperature of the battery.

4. The method for evaluating the safety of a battery upon an internal short-circuit in accordance with claim 1, wherein the battery information is sound produced by the battery, and the occurrence of the internal short-circuit is detected by detecting sound produced by the battery due to the internal short-circuit.

5. The method for evaluating the safety of a battery upon an internal short-circuit in accordance with claim 1, wherein the battery information is light produced by the battery, and the occurrence of the internal short-circuit is detected by detecting light produced by the battery due to the internal short-circuit.

6. The method for evaluating the safety of a battery upon an internal short-circuit in accordance with claim 1, wherein the internal short-circuit caused by disassembling the assembled battery, taking the electrode group out of the housing, inserting the foreign object into the location inside the electrode group where the positive electrode and the negative electrode face each other from the direction parallel to the surface of the positive electrode or the negative electrode, reassembling, and applying a pressure.

7. The method for evaluating the safety of a battery upon an internal short-circuit in accordance with claim 1, wherein the internal short-circuit caused by disassembling the assembled battery, taking the electrode group from the housing, and inserting an insulating sheet and the foreign object in layers into the location inside the electrode group where the positive electrode and the negative electrode face each other from the direction parallel to the surface of the positive electrode or the negative electrode, reassembling, pulling out the insulating sheet, and applying a pressure.

8. The method for evaluating the safety of a battery upon an internal short-circuit in accordance with claim 7, wherein the insulating sheet is heat-resistant.

9. The method for evaluating the safety of a battery upon an internal short-circuit in accordance with claim 1, wherein the application of the pressure is stopped upon detection of the occurrence of the internal short-circuit.

10. The method for evaluating the safety of a battery upon an internal short-circuit in accordance with claim 9, wherein the pressure applied is monitored and the application of the pressure is stopped upon detection of a decrease in the pressure.

11. The method for evaluating the safety of a battery upon an internal short-circuit in accordance with claim 1, wherein the pressure is applied at a constant speed.

12. The method for evaluating the safety of a battery upon an internal short-circuit in accordance with claim 1, wherein the pressure applied is constant.

13. The method for evaluating the safety of a battery upon an internal short-circuit in accordance with claim 1, wherein the pressure applied is 50 kg/cm$^2$ or less.

14. The method for evaluating the safety of a battery upon an internal short-circuit in accordance with claim 1, wherein the foreign object is a conductive foreign object.

15. The method for evaluating the safety of a battery upon an internal short-circuit in accordance with claim 1, wherein the foreign object is anisotropic.

16. The method for evaluating the safety of a battery upon an internal short-circuit in accordance with claim 15, wherein the foreign object has at least one shape selected from the group consisting of a horseshoe-like shape, a cone, a pyramid, a cylinder which has a ratio of length/diameter $\geq 1.5$, and a rectangular parallelepiped which has a ratio of the length of the longest side/the length of the other two sides $\geq 1.5$.

17. The method for evaluating the safety of a battery upon an internal short-circuit in accordance with claim 1, wherein the foreign object is inserted before the electrolyte is injected in a battery production process.

18. The method for evaluating the safety of a battery upon an internal short-circuit in accordance with claim 17,
wherein the battery is a lithium secondary battery,
the foreign object includes Ni, Cu, stainless steel, or Fe, and
the foreign object is inserted between the negative electrode and the insulating layer at the location where the positive electrode and the negative electrode face each other.

19. The method for evaluating the safety of a battery upon an internal short-circuit in accordance with claim 17,
wherein the battery is a lithium secondary battery,
the foreign object includes Al or stainless steel, and
the foreign object is inserted between the positive electrode and the insulating layer at the location where the positive electrode and the negative electrode face each other.

20. The method for evaluating the safety of a battery upon an internal short-circuit in accordance with claim 1,
wherein the battery is a lithium secondary battery, and
the foreign object is inserted onto the electrode inside the electrode group such that a+b≦d where a represents the thickness of an active material layer of the positive electrode, b represents the thickness of the insulating layer, and d represents the length of the foreign object in the direction perpendicular to the surface of the electrode.

21. The method for evaluating the safety of a battery upon an internal short-circuit in accordance with claim 1,
wherein the foreign object is inserted onto the electrode inside the electrode group such that 2b+c+e≦d where b represents the thickness of the insulating layer, c represents the thickness of the positive electrode, d represents the length of the foreign object in the direction perpendicular to the surface of the electrode, and e represents the thickness of the negative electrode plate.

22. The method for evaluating the safety of a battery upon an internal short-circuit in accordance with claim 1, wherein the internal short-circuit causing method (b) is performed by inserting a shape memory alloy or bimetal into a location inside the electrode group of the battery where the positive electrode and the negative electrode face each other, and heating or cooling the shape memory alloy or bimetal to deform it and locally crush the insulating layer.

23. The method for evaluating the safety of a battery upon an internal short-circuit in accordance with claim 1, wherein the internal short-circuit causing method (c) is performed by cutting a certain area of the insulating layer at a location where the positive electrode and the negative electrode face each other, and applying a pressure to the cut area.

24. The method for evaluating the safety of a battery upon an internal short-circuit in accordance with claim 23, wherein the insulating layer is cut before the electrode group is assembled.

25. The method for evaluating the safety of a battery upon an internal short-circuit in accordance with claim 23,
wherein the insulating layer is cut after disassembling the assembled battery and taking out the electrode group from the housing, and
the battery is reassembled after the cutting of the insulating layer.

26. The method for evaluating the safety of a battery upon an internal short-circuit in accordance with claim 23,
wherein the electrode group is assembled with an insulating sheet placed on at least one face of the cut area of the insulating layer, and
after the insulating sheet is pulled out of the resultant electrode group, a pressure is applied to the cut area.

27. The method for evaluating the safety of a battery upon an internal short-circuit in accordance with claim 1,
wherein in the internal short-circuit causing method (d), the battery that includes the positive electrode having an exposed part of the current-collecting terminal at an outermost part is a lithium secondary battery, and
the internal short-circuit causing method (d) is performed by inserting a pressing member with a sharp edge until it reaches the exposed part of the current-collecting terminal while applying ultrasonic waves thereto, and further inserting the pressing member into the battery without applying the ultrasonic waves.

28. The method for evaluating the safety of a battery upon an internal short-circuit in accordance with claim 1,
wherein in the internal short-circuit causing method (e), the battery that includes the positive electrode having an exposed part of the current-collecting terminal at an outermost part is a lithium secondary battery, and
the internal short-circuit causing method (e) is performed by cutting the exposed part of the current-collecting terminal of the positive electrode at the outermost part without causing a continuing short-circuit, and inserting a pressing member with a sharp edge into the cut part.

29. The method for evaluating the safety of a battery upon an internal short-circuit in accordance with claim 28, wherein the exposed part of the current-collecting terminal at the outermost part of the battery is cut by using an ultrasonic cutter.

30. The method for evaluating the safety of a battery upon an internal short-circuit in accordance with claim 1, wherein in the internal short-circuit causing method (f), the battery is a battery including a wound-type electrode group, and the internal short-circuit causing method (f) is performed by inserting a pressing member with a sharp edge into a bottom of the battery.

31. The method for evaluating the safety of a battery upon an internal short-circuit in accordance with claim 1, wherein in the internal short-circuit causing method (f), the battery is a battery including a wound-type electrode group, and the internal short-circuit causing method (f) is performed by inserting a pressing member with a sharp edge into a substantially central part of a bottom of the battery slantwise relative to a winding axis of the electrode group.

32. The method for evaluating the safety of a battery upon an internal short-circuit in accordance with claim 1, wherein the internal short-circuit causing method (h) is performed by locally heating the outer face of the battery to a temperature equal to or higher than the melting point of the insulating layer to locally melt the insulating layer of the battery.

33. The method for evaluating the safety of a battery upon an internal short-circuit in accordance with claim 32, wherein the heating is performed by bringing a heat generator having a temperature equal to or higher than the melting point of the insulating layer close to the battery.

34. The method for evaluating the safety of a battery upon an internal short-circuit in accordance with claim 33, wherein the heat generator is a soldering iron.

35. The method for evaluating the safety of a battery upon an internal short-circuit in accordance with claim 32, wherein the outer face of the battery heated to a temperature equal to or higher than the melting point of the insulating layer is a connection area between the housing and the current-collecting terminal.

36. The method for evaluating the safety of a battery upon an internal short-circuit in accordance with claim 32, wherein the electrode group taken out of the housing of the assembled battery is locally heated.

37. The method for evaluating the safety of a battery upon an internal short-circuit in accordance with claim 36,
wherein the battery is a lithium secondary battery including a positive electrode that has an exposed part of a current-collecting terminal at an outermost part, and
the electrode group is taken out of the housing of the assembled lithium secondary battery,
the exposed part of the current-collecting terminal of the positive electrode is cut, and
the electrode group is locally heated.

38. A device for evaluating an internal short-circuit of a battery, the device comprising:
pressure applying means for applying a pressure to at least a part of the battery;
height-position detecting means for detecting the height position of the pressure applying means;

pressure controlling means for adjusting the pressure applied by the pressure applying means;

battery information measuring means for measuring battery information;

at least one short-circuit detecting means for determining whether or not an internal short-circuit has occurred by comparing a measurement result produced by the battery information measuring means with a reference value of an internal short-circuit, and for producing an internal short-circuit detection signal depending on a result of the determination; and at least one controlling means including a control circuit for producing a control signal depending on the detection signal from the short-circuit detecting means and a controller for detecting the control signal from the control circuit.

39. The device for evaluating an internal short-circuit of a battery in accordance with claim 38, further comprising ultrasonic wave generating means for applying ultrasonic waves to at least a part of the battery, and ultrasonic wave controlling means for controlling the ultrasonic wave generating means.

* * * * *